(12) United States Patent
Chin et al.

(10) Patent No.: US 6,350,311 B1
(45) Date of Patent: Feb. 26, 2002

(54) METHOD FOR FORMING AN EPITAXIAL SILICON-GERMANIUM LAYER

(75) Inventors: Albert Feng-Der Chin, Hsinchu Hsien; Ming-Jang Hwang, Yun-Ling Hsien, both of (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/515,017

(22) Filed: Feb. 29, 2000

(30) Foreign Application Priority Data

Jun. 17, 1999 (TW) .......................................... 88110184

(51) Int. Cl.[7] ................................................. C30B 1/10
(52) U.S. Cl. ..................... 117/3; 117/4; 117/5; 117/7; 117/8; 117/9
(58) Field of Search ................................. 117/3, 4, 5, 7, 117/8, 9

(56) References Cited

U.S. PATENT DOCUMENTS

| | | | | |
|---|---|---|---|---|
| 5,216,271 A | * | 6/1993 | Takagi et al. | 257/370 |
| 5,821,149 A | * | 10/1998 | Schuppen et al. | 438/312 |
| 6,030,894 A | * | 2/2000 | Hada et al. | 438/675 |
| 6,075,291 A | * | 2/2000 | Thakur | 257/751 |

OTHER PUBLICATIONS

Ghandhi, VLSI Fabrication Principles, Silicon and Gallium Arsenide, John Wiley & Sons, New York pp. 517–520, 1983.*

* cited by examiner

*Primary Examiner*—Robert Kunemund
(74) *Attorney, Agent, or Firm*—J.C. Patents

(57) ABSTRACT

A method for growing an epitaxial silicon-germanium layer is described. The method includes removing a native oxide layer on the silicon substrate surface. A HF vapor treatment process is then conducted on the silicon substrate. Thereafter, a germanium layer is formed on the silicon substrate, followed by performing a rapid thermal anneal process under an inert gas to form a silicon-germanium alloy layer on the surface of the silicon substrate.

23 Claims, 8 Drawing Sheets

METHOD FOR FORMING AN EPITAXIAL SILICON-GERMANIUM LAYER

CROSS-REFERENCE TO RELATED APPLICATION

This application claims the priority benefit of Taiwan application serial no. 88110184, filed Jun. 17,1999.

BACKGROUND OF THE INVENTION

1. Field of the Invention

The present invention relates to a method for fabricating a semiconductor device. More particularly, the present invention relates to a method for forming an epitaxial silicon-germanium (SiGe) layer.

2. Description of the Related Art

There is a continuing effort in the semiconductor industry to increase the integration on a semiconductor device. There have been, however, many problems in developing a highly integrated device due to physically imposed limitations of the semiconductor device itself. For example, in order to achieve a highly integrated device, there should be a reduction in the device dimension. A reduction of the dimension for a device, for example, a metal-oxide-semiconductor field effect transistor (MOSFET), parasitic capacitance and resistances at the gate and the source/drain region would increase correspondingly. Any reduction in the dimension, therefore, would inhibit the increase of the overall efficiency and performance of an integrated device. If the device were one step further being reduced in size, a majority area of the device would be occupied by the ohmic contact of the source/drain region. This problem is especially significant in a p-MOSFET device.

The charge carriers for a p-MOSFET device are mainly the electric holes. The mobility of the electric holes is worst than that of the electrons, which are the charge carriers for an n-MOSFET device. Therefore, when the device dimension is being reduced and the resistance is correspondingly increased, the adverse effects are more significant on a p-MOSFET device. As a result, the semiconductor industry has been focused on resolving the problem of reducing the dimension of a p-MOSFET device while maintaining or even increasing the device efficiency.

In recent years, growing a layer of silicon-germanium alloy (SiGe/Si) on a silicon wafer surface of a MOSFET device at a temperature below 600 degree Celsius using ultra high vacuum chemical vapor deposition (UHVCVD) or molecular beam epitaxy (MBE) has been developed. Since the radius of a germanium atom is greater than the radius of a silicon atom, when a portion of the silicon atoms in the silicon lattice is replaced by the germanium atoms, the entire lattice would be strained. As a result, even when the charge carrier densities are the same, the mobility of the electric holes and the mobility of the electrons for a strained silicon (Si) lattice or a strained SiGe/Si alloy lattice would increase 5 times and 10 times, respectively, when compared to the unstrained single silicon crystal.

Applying the SiGe/Si alloy formed according to the above method to form an integrated device seems to be able to resolve the problems encountered when the device dimension is being reduced. However, in order to integrate the entire manufacturing process and, at the same time, to avoid the lattice defect formation in the strained SiGe/Si alloy is not an easy task. Since, during the subsequent thermal processing, the high temperature would increase the vibrational motion of the atoms in the SiGe/Si alloy, the strained energy of the SiGe lattice is increased. When the strained energy of the lattice is reached to a certain degree, the excessive strained energy is released by breaking the bonding between atoms. The problem of a current leakage is thereby subsequently resulted.

The first problem encountered in applying a SiGe/Si alloy to manufacture a MOSFET device is the thermal oxidation process used in forming the gate oxide layer. The high temperature would induce defects in the SiGe lattice, directly affecting the quality of the gate oxide layer. Furthermore, the source/drain region of a MOSFET device in general has the ohmic contact, which is formed by the implanting and the driving-in of ions by means of an anneal process to form the source/drain region of the MOSFET device, followed by forming a conductive contact plug on the source/drain region. The high temperature in the anneal process, however, would destroy the lattice structure of the SiGe/Si alloy, resulting with defects in the lattice structure. A Schottky junction, on the other hand, can be formed by directly forming the metal plug on a predetermined region on the p-type or the n-type substrate. In this case, the high temperature anneal process is being avoided because the ion implantation process is not required. The source/drain region of a SiGe/Si alloy MOSFET, therefore, can not have the usual ohmic contact, but rather a Schottky junction is formed, and the Schottky junction is usually formed in high-speed circuitry. K. Ismail in the 1997 IEEE International Solid State Circuits Conference (paper FA7.1) indicates that the application of the Schottky junction is limited to lower integration devices, wherein the electrical consumption is low and the operational speed is fast. The application of the Schottky junction is therefore very limited.

SUMMARY OF THE INVENTION

Based on the foregoing, the present invention provides a method for growing an epitaxial silicon-germanium (SiGe) layer. This method includes conducting a cleaning process on the silicon substrate surface to remove the native oxide layer, followed by using a 40% to 60% concentrated hydrogen fluoride (HF) solution to vapor treat the silicon substrate surface and to suppress the native oxide formation. A germanium layer is the formed on the silicon substrate by physical vapor deposition. A rapid thermal annealing is then conducted at a temperature of about 850 degree Celsius to about 950 degree Celsius under an inert gas to form a SiGe/Si alloy on the substrate surface.

The present invention provides a method for growing an epitaxial SiGe layer and an oxide layer, the method includes removing the native oxide layer followed by performing a surface treatment process to suppress a native oxide formation on the substrate surface. The surface treatment process includes performing a hydrogen fluroide (HF) vapor treatment on the silicon substrate using a 40%–60% concentrated HF solution. After this, a layer of germanium is formed on the silicon substrate by physical vapor deposition. A rapid thermal anneal process is then conducted at a temperature of 850 degree Celsius to 950 degree Celsius under an inert gas to form a layer of SiGe/Si alloy. Thermal oxidation is further conducted to form a SiGe oxide layer on the SiGe/Si alloy.

The present invention provides a fabrication method for a Metal Oxide Semiconductor (MOS) device using an epitaxial SiGe layer. This method includes using a corrosive chemical to remove the native oxide layer on the silicon substrate surface, followed by using a 40% to 60% concentrated HF solution to vapor treat the silicon substrate surface.

Physical vapor deposition is then conducted to form a germanium layer on the silicon substrate, followed by performing a rapid thermal anneal process at a temperature of about 850 to 950 degree Celsius under an inert gas to form a SiGe/Si alloy layer on the surface of the silicon substrate. Thereafter, thermal oxidation is conducted at about 850 degree Celsius to about 950 degree Celsius to form a SiGe oxide layer on the surface of the SiGe/Si alloy layer. The SiGe oxide layer on the surface of the SiGe/Si alloy layer thus serves as the gate oxide layer for the MOS device. Thereafter, a gate is formed on a predetermined region of the SiGe oxide layer. Ion implantation and annealing are further conducted to form a source/drain region on both sides of the gate.

According to the fabrication method of the present invention, the SiGe/Si alloy layer is formed under a high temperature, the lattice strained energy of the SiGe/Si alloy layer is going to be lower than the SiGe/Si alloy layer formed under a low temperature. The SiGe/Si alloy layer, formed according to the present invention, thereby can withstand the high temperature of the subsequent thermal processes of the semiconductor manufacturing, for example, the thermal oxidation process in forming the SiGe oxide layer or the anneal process after the implanting of ions for the source/drain region.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIG. 1A to 1E are schematic, cross-sectional views showing the manufacturing of a Metal Oxide Semiconductor (MOS) device using an epitaxial silicon-germanium (SiGe) layer formed according to the preferred embodiment of the present invention.

Figure 1A:
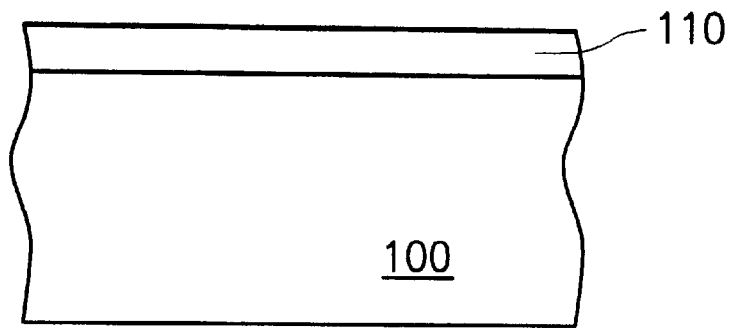
FIGS. 1A to 1E are schematic, cross-sectional views showing the manufacturing of a Metal Oxide Semiconductor (MOS) device using an epitaxial silicon-germanium (SiGe) layer formed according to the preferred embodiment of the present invention.

Referring to FIG. 1A, a native oxide 110 is formed on the surface of a silicon substrate 100 when the substrate 100 is exposed to air. The silicon substrate 100 includes the p-type, the (100) lattice orientation, single crystal silicon.

Figure 1B:
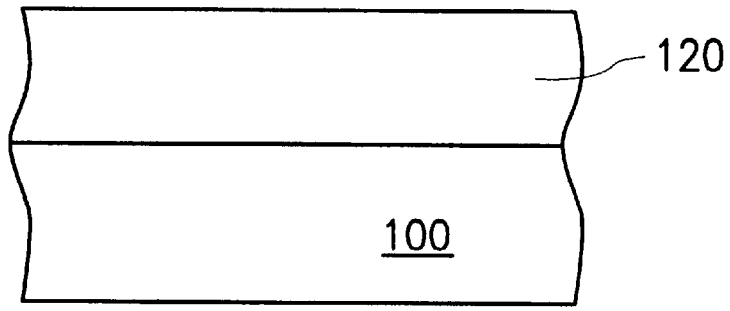

Referring to FIG. 1B, the native oxide layer 110 is removed using a corrosive chemical, for example, using a $H_2O_2/NH_4OH/H_2O$ solution at a ratio of 0.25–1:0.5–1:5–6 to clean the surface of the substrate 100. The substrate 100 is further soaked in a hydrogen fluoride (HF) solution for an appropriate period of time, followed by cleaning the substrate surface with deionized water. The substrate 100 is then spin-dried under a nitrogen gas. The substrate 100 is further subjected to a HF vapor treatment to suppress oxidation of surface of the silicon substrate 100, preventing the growth of an native oxide. The HF vapor includes a 50% concentrated HF solution at the saturated vapor pressure.

An amorphous germanium layer 120 is then formed on the substrate 100 surface. The amorphous germanium layer 120 is formed by, for example, physical vapor deposition, such as sputtering or evaporation. During the formation of the germanium layer 120, the vacuum condition is preferably maintained at about $2 \times 10^{-6}$ torr.

Figure 1C:
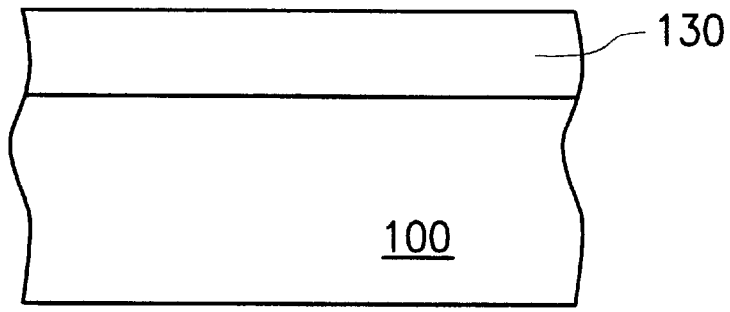

Referring to FIG. 1C, rapid thermal annealing (RTA) is then conducted under an inert gas to induce a reaction between the germanium layer 120 and the silicon substrate 100 and to form a SiGe/Si alloy layer 130 on the silicon substrate 100 surface. For a germanium layer 120 of about 250 angstroms thick, the SiGe/Si layer 130 can grow to a thickness of about 500 angstroms. The inert gas used in forming the SiGe/Si alloy includes those gases that do not induce oxidation such as a nitrogen gas, an argon gas or a neon gas. The rapid thermal annealing is conducted at a temperature of about 800 degree Celsius to about 1000 degree Celsius for about 30 seconds to 120 seconds, and is preferably conducted at a temperature of about 850 degree Celsius to about 950 degree Celsius for about 60 seconds.

The SiGe/Si alloy layer 130 prepared according to the above process is confirmed to have an uniform $Si_{0.3}Ge_{0.7}$ layer transformed from the $Si_{0.6}Ge_{0.4}$ layer by the Secondary Ion Mass Spectroscopy (SIMS) measurement.

Figure 1D:
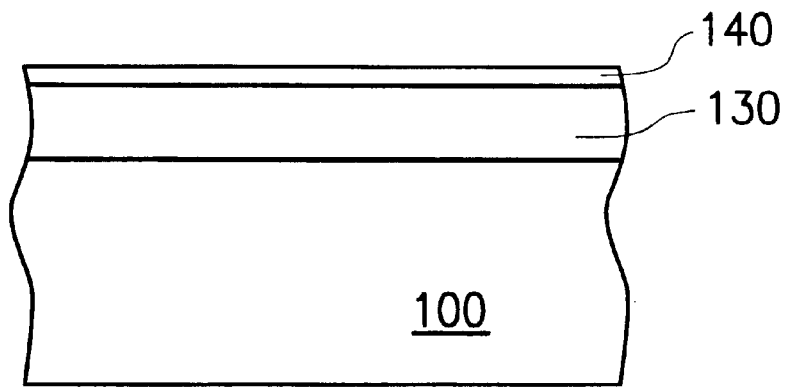

Continuing to FIG. 1D, thermal oxidation is then conducted to form a SiGe oxide layer 140 on the surface of the SiGe/Si alloy layer 130 as the MOS gate oxide layer. Thermal oxidation is conducted at a temperature of about 850 degree Celsius to about 950 degree Celsius.

Figure 1E:
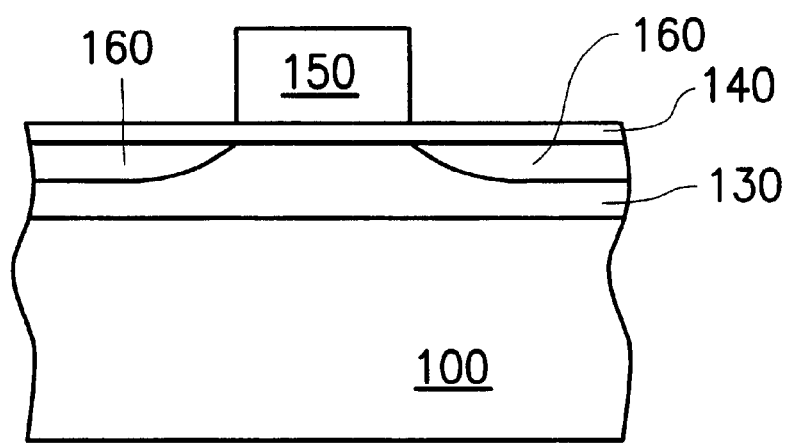

Referring to FIG. 1E, a gate 150 is then formed on a pre-determined region on of the Si/Ge oxide layer 140. Ion implantation and annealing are further conducted to form a source/drain region 160 in the SiGe/Si layer on both sides of the gate 150. The process of forming the source/drain region 160 is familiar to those who are skilled in the art, therefore will not reiterated.

A corresponding (MOS) device is also formed, wherein the HF vapor treatment step is eliminated. The x-ray diffraction spectra (Figure now shown) for the corresponding (MOS) device indicate that a poor quality SiGe/Si alloy layer 130 is resulted. The spectra result shows a very weak $Si_{0.5}Ge_{0.5}$ signal, indicating many defects in the lattice structure and is probably due to a residual native oxide layer of about 5 to 7 angstroms thick on the silicon substrate 100 surface.

If a thicker oxide layer is deliberately formed on the silicon substrate followed by forming the germanium layer 120 and the SiGe/Si alloy layer 130, the SiGe diffraction line is hardly noticeable from the X-ray diffraction spectra. This result suggests that either almost no SiGe/Si alloy layer 130 is formed or the structure of the SiGe/Si alloy layer 130 is either polycrystalline or amorphous. If the RTA temperature is increased, for example, from 950 degree Celsius to about 1000 degree Celsius, the result would remain the same, indicting the diffusion of atoms due to the motion of atoms would be hindered by the silicon oxide layer between the silicon substrate 100 and the germanium layer 120.

The following is a summary of the evaluations performed on the epitaxial SiGe layer and the $SiGeO_2$ layer, and their applications to a MOS device.

Figure 2:
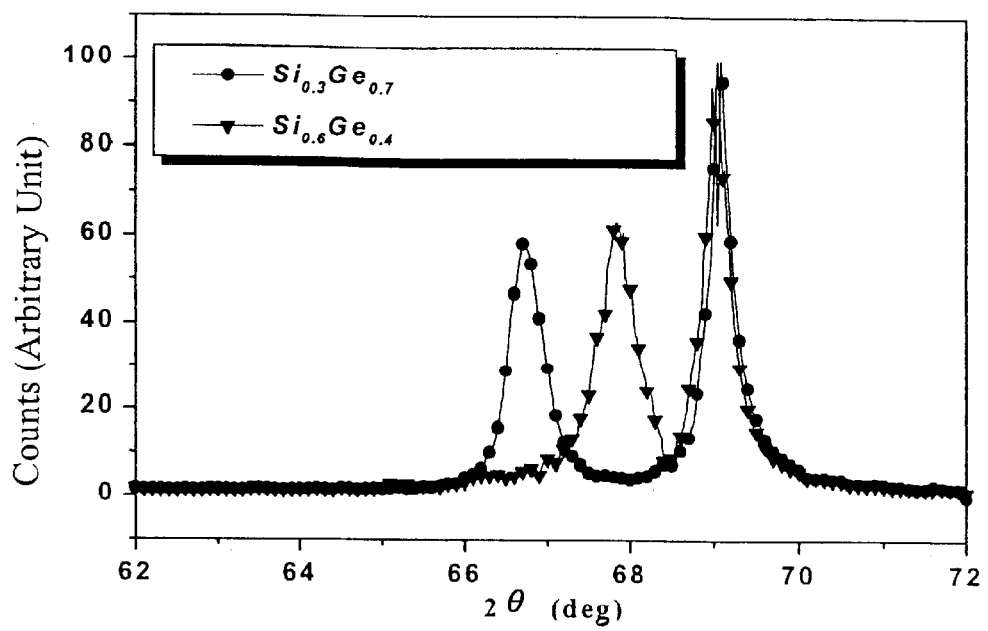
FIG. 2 is the X-ray diffraction spectrum for a $Si_{0.6}Ge_{0.4}$ layer, a $Si_{0.3}Ge_{0.7}$ layer and a single crystal silicon.

FIG. 2 is an X-ray diffraction spectrum for a $Si_{0.6}Ge_{0.4}$ layer, a $Si_{0.3}Ge_{0.7}$ layer and a single crystal silicon (Si). As shown in FIG. 2, sharp diffraction peaks for the $Si_{0.6}Ge_{0.4}$ layer, the $Si_{0.3}Ge_{0.7}$ layer and the single crystal silicon are clearly identified on the spectra, reflecting the lattice constants for the three materials increases as the content of Ge increases. Since the diffraction peaks for $Si_{0.6}Ge_{0.4}$ and $Si_{0.3}Ge_{0.7}$ are sharp and narrow, similar to the diffraction peak for the single crystal silicon, suggesting that the crystalline property of SiGe is good.

Atomic force microscopy (AFM) and transmission electron microscopy (TEM) are further used to evaluate the planarity of the surfaces of a $Si_{0.3}Ge_{0.7}$ layer and a $Si_{0.3}Ge_{0.7}O_2$ layer, and the interface between the $Si_{0.3}Ge_{0.7}$ layer and the $Si_{0.3}Ge_{0.7}O_2$ layer. The AFM pictures (not included) indicate that the surface roughness of the $Si_{0.3}Ge_{0.7}$ layer and the $Si_{0.3}Ge_{0.7}O_2$ layer is about 1.5 and 1.6, respectively, similar to the surface roughness of a Si layer and a $SiO_2$ layer. The TEM pictures (not included), however, show that the interface between the $Si_{0.3}Ge_{0.7}O_2$ layer and the $Si_{0.3}Ge_{0.7}0$, layer are very smooth. These results confirm that both the structural integrity for the SiGe layer and the $SiGeO_2$ layer and the interface between the two layers have good quality.

Figure 3:
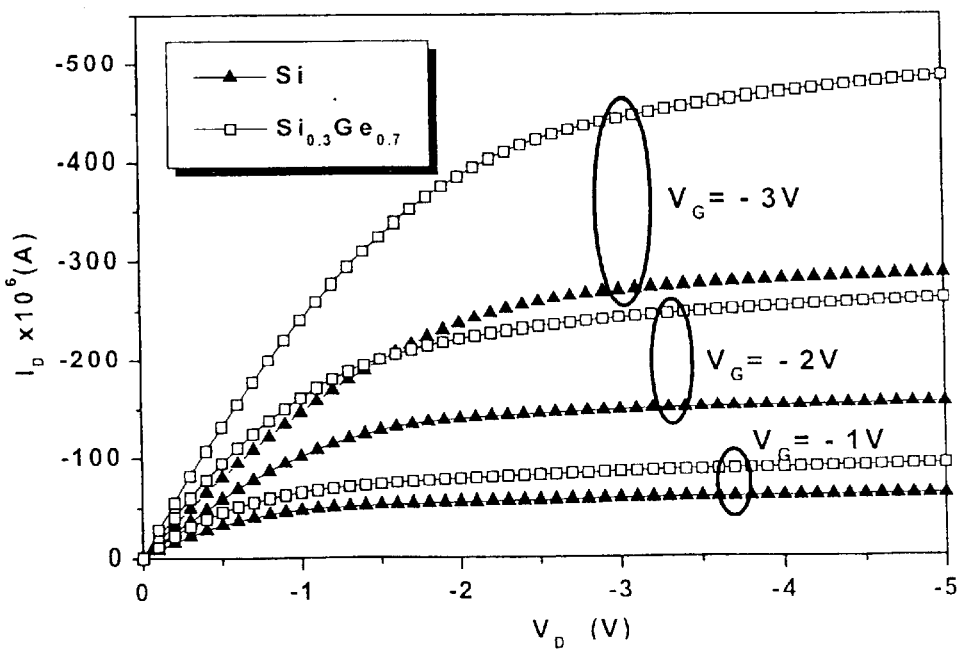
FIG. 3 is a diagram illustrating the $I_D$-$V_D$ characteristics of a standard Si-based and p-MOSFET and a $Si_{0.3}Ge_{0.7}$ p-MOSFET, where the gate length is about 3 microns.
Figure 4:
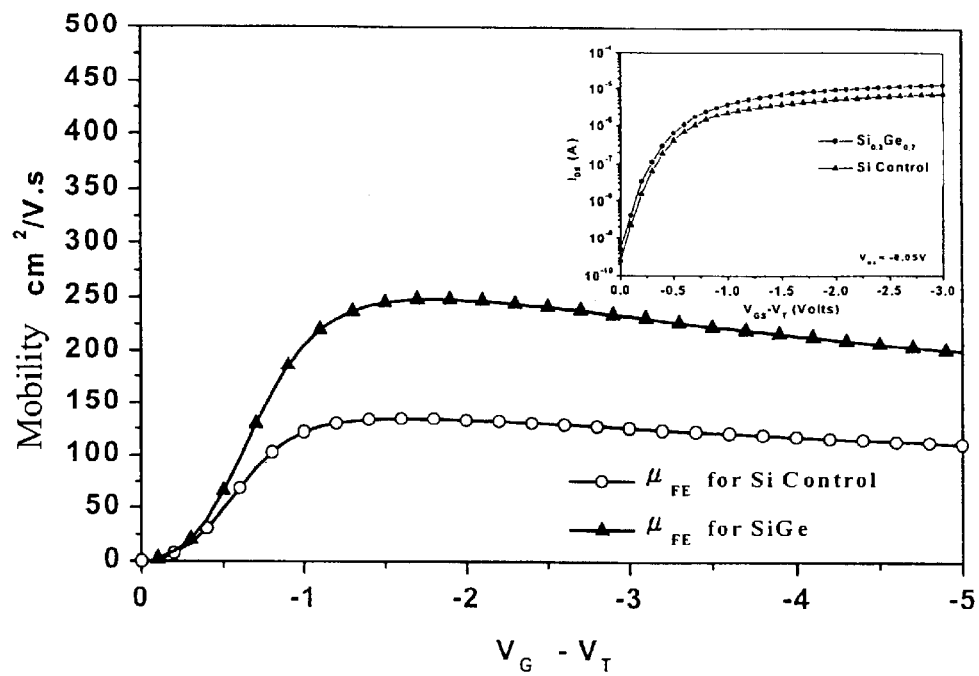
FIG. 4 is a diagram showing the field effect mobilities of the holes of a standard Si-based p-MOSFET and a $Si_{0.3}Ge_{0.7}$ p-MOSFET.

Referring to FIGS. 3 and 4, wherein FIG. 3 illustrates the I-V characteristics between a standard Si-based and a SiGe p-MOSFET with a gate length of about 3 microns, and FIG. 4 compares the field effect mobilities of the holes between a standard Si-based and a $Si_{0.3}Ge_{0.7}$ p-MOSFET. As shown in FIG. 3, under the same $V_D$, the $I_D$ of a $Si_{0.3}Ge_{0.7}$ p-MOSFET is about two times of that of the standard Si-based p-MOSFET. As shown in FIG. 4, the holes mobility of a $Si_{0.3}Ge_{0.7}$ p-MOSFET is about two times of that of the standard Si-based p-MOFET under the same $V_{GS}$-$V_T$. Furthermore, the holes mobility of the $Si_{0.3}Ge_{0.7}$ p-MOSFET increases as the Ge content increases. These results indicate that a p-MOSFET formed with a $Si_{0.3}Ge_{0.7}$ layer, the operational speed would increase because the mobility of the charge carrier, namely the holes, increases.

Figure 5:
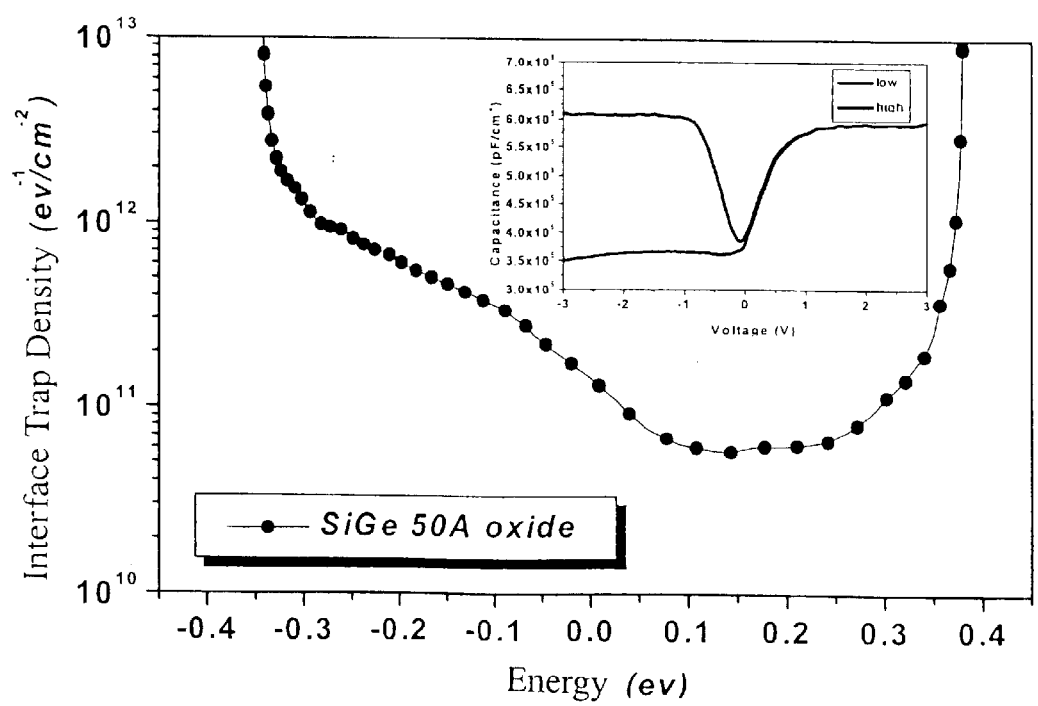
FIG. 5 is a diagram showing the interface trap density of a standard Si-based and p-MOSFET and of a $Si_{0.3}Ge_{0.7}$ p-MOSFET.

FIG. 5 illustrates the interface trap density ($D_{11}$) of a $Si_{0.3}Ge_{0.7}$ p-MOS capacitor and of a Si-based p-MOS capacitor. As shown in FIG. 5, the interface trap density value is very low, wherein the mid-gap value is only about $5.9 \times 10^{10}$ $eV^{-1}cm^{-2}$. The result suggests that there is very little defect at the interface between the $Si_{0.3}Ge_{0.7}$ layer and the $Si_{0.3}Ge_{0.7}O_2$ layer. These two structures, having very little defect, are thus suitable for a MOSFET device.

Figure 6:
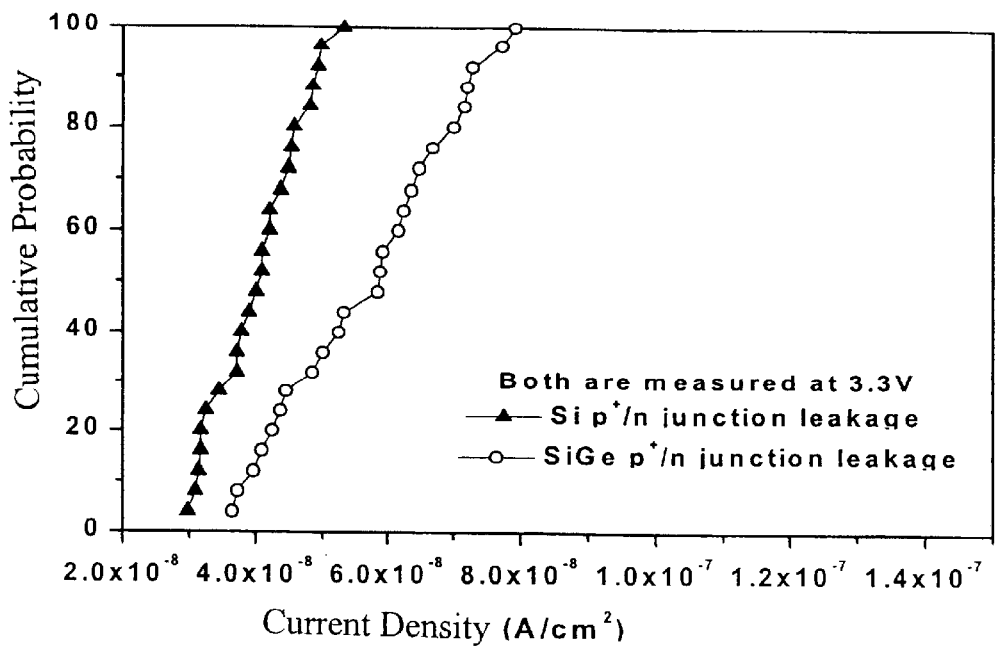
FIG. 6 is a diagram showing the leakage current probability distributions for the standard Si-based p-MOSFET and the $Si_{0.3}Ge_{0.7}$ p-MOSFET at an external voltage of 3.3 V.

Continuing to FIG. 6, FIG. 6 is a diagram showing the leakage current probability distributions for the standard Si-based p-MOSFET and the $Si_{0.3}Ge_{0.7}$ p-MOSFET at an external voltage of 3.3V. Based on FIG. 6, at the same cumulative probability, the leakage current of a $Si_{0.3}Ge_{0.7}$ p-MOSFET device is slightly higher than that for a Si p-MOSFET device. Since the band gap of a SiGe layer is smaller than the band gap of a single crystal Si, the leakage current of the SiGe layer is naturally higher. The result from FIG. 6 clearly demonstrates that junction quality of a $Si_{0.3}Ge_{0.7}$ p-MOSFET is compatible to that of a Si p-MOSFET.

Figure 7:
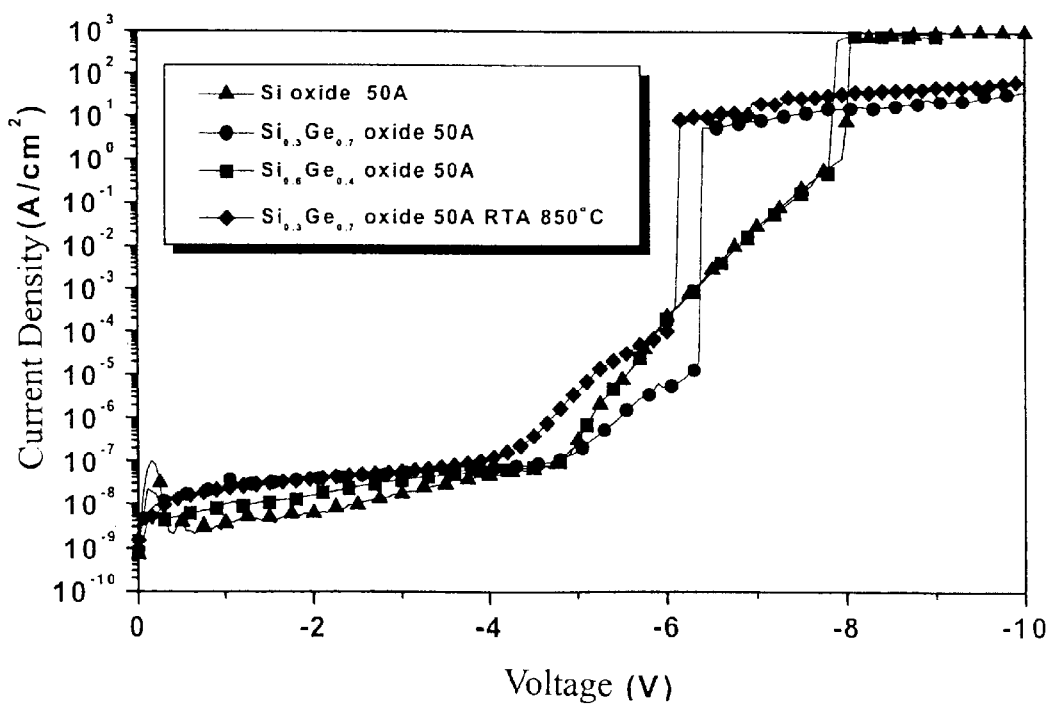
FIG. 7 is a diagram showing the I-V characteristics of the gate oxide layers of a $Si_{0.3}Ge_{0.7}$ p-MOSFET, a $Si_{0.6}Ge_{0.4}$ p-MOSFET and a standard Si-based p-MOSFET, respectively.

The following are experimental results, which demonstrate the structural quality of the gate oxide layer of a SiGe p-MOSFET by evaluating the leakage current property and the breakdown voltage property of the gate oxide layer. FIG. 7 is a comparison of the I-V characteristics of the gate oxide layer between the $Si_{0.3}Ge_{0.7}$, the $Si_{0.6}Ge_{0.4}$, and the standard Si p-MOSFET. The thickness of the gate oxide layers is about 50 angstroms and are formed by thermal oxidation. As shown in FIG. 7, the breakdown voltage ($V_{BD}$) gradually decreases as the content of Ge increases, which has very little effect on the leakage current. Furthermore, the leakage current of a p-MOSFET gate oxide layer is also different when the RTA temperature for forming the $Si_{0.3}Ge_{0.7}$ is different. The leakage current of the p-MOSFET gate oxide layer with the $Si_{0.3}Ge_{0.7}$ layer formed at a RTA temperature of about 850 degree Celsius is higher than the leakage current when the $Si_{0.3}Ge_{0.7}$ layer is formed a RTA temperature at about 900 degree Celsius.

Figure 8:
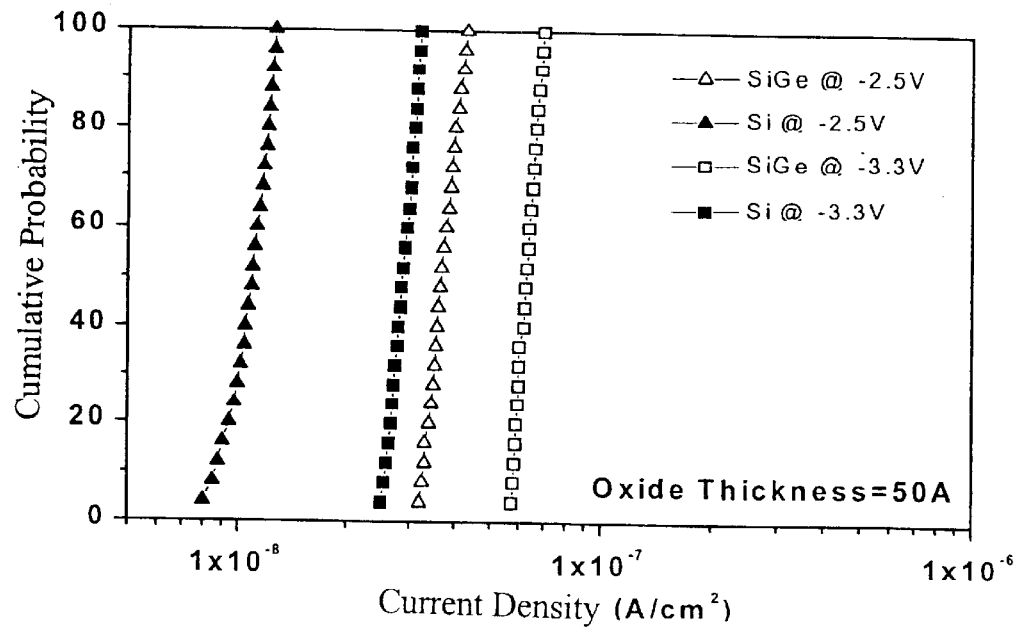
FIG. 8 is a diagram showing the current leakage cumulative probability distributions for a $Si_{0.3}Ge_{0.7}$ p-MOSFET gate oxide layer and a standard Si p-MOSFET gate oxide layer.

FIG. 8 compares the current leakage cumulative probability distributions between a $Si_{0.3}Ge_{0.7}$ p-MOSFET gate oxide layer and a Si-based p-MOSFET gate oxide layer. The two gate oxide layers are formed by thermal oxidation and have a thickness of about 50 angstroms. As shown in FIG. 8, under the same cumulative probability, the leakage current density of the $Si_{0.3}Ge_{0.7}$ p-MOSFET gate oxide layer is slightly higher, but very close to that of the Si-based p-MOSFET gate oxide layer, indicating that the $Si_{0.3}Ge_{0.7}$ p-MOSFET gate oxide layer formed by thermal oxidation has a good quality.

Figure 9:
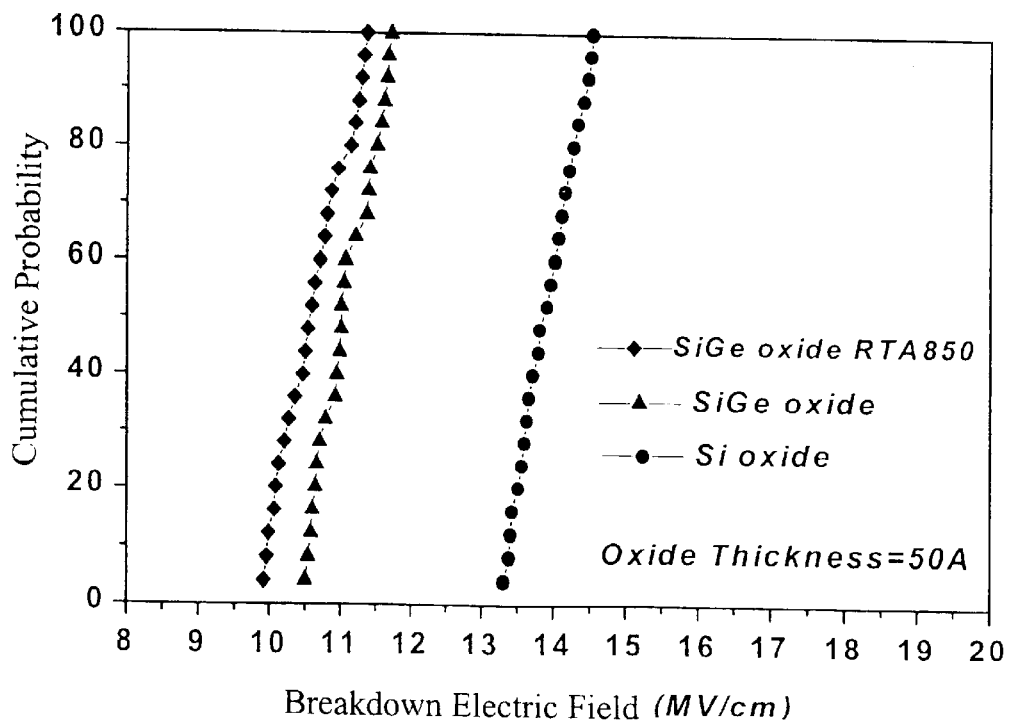
FIG. 9 is a diagram showing the breakdown electric field probability distributions for a $Si_{0.3}Ge_{0.7}$ p-MOSFET gate oxide layer and a standard Si p-MOSFET gate oxide layer, where the two gate oxide layers are about 50 angstroms thick and are formed by thermal oxidation.

Referring to FIG. 9, where FIG. 9 illustrates the breakdown electric field probability distributions for a $Si_{0.3}Ge_{0.7}$ p-MOSFET gate oxide layer and a Si-based p-MOSFET gate oxide layer. The two gate oxide layers are about 50 angstroms thick and are formed by thermal oxidation. As shown in FIG. 9, the breakdown electric field for the $Si_{0.3}Ge_{0.7}$ p-MOSFET gate oxide layer is slightly lower but very close to that for the Si-based p-MOSFET, indicating that the $Si_{0.3}Ge_{0.7}$ p-MOSFET gate oxide layer formed by thermal oxidation has a good quality. Furthermore, the breakdown electric field for the p-MOSFET gate oxide layer is also different, under the same cumulative probability, when the RTA temperature for forming the $Si_{0.3}Ge_{0.7}$ is different. The breakdown electric field for the gate oxide layer for a p-MOSFET is lower when the $Si_{0.3}Ge_{0.7}$ layer is formed at a RTA temperature of about 850 degree Celsius than that being formed at a about 900 degree Celsius. These results suggest that the strained energy is released when the $Si_{0.3}Ge_{0.7}$ layer is formed at a at a higher temperature. The integrity of the lattice structure is thus maintained. Based on the above discussion, the RTA temperature at 900 degree Celsius provides a better result than at 850 degree Celsius.

Still referring to FIG. 9, the I-V characteristics, the leakage current probability distributions, and the breakdown electric field probability distributions of a 30 angstroms thick gate oxide layer for a $Si_{0.3}Ge_{0.7}$ p-MOSFET and for a standard Si-based p-MOSFET are determined. The results indicate that the quality of the $Si_{0.3}Ge_{0.7}$ p-MOSFET gate oxide layer is compatible to that of the Si-based p-MOSFET gate oxide layer. Comparing to a 50 angstroms thick gate oxide layer of a $Si_{0.3}Ge_{0.7}$ p-MOSFET, the 30 angstroms thick gate oxide layer of the $Si_{0.3}Ge_{0.7}$ p-MOSFET has a lower leakage current and a higher breakdown electric field. Both types of gate oxide layer have a certain degree of improvement.

Figure 10:
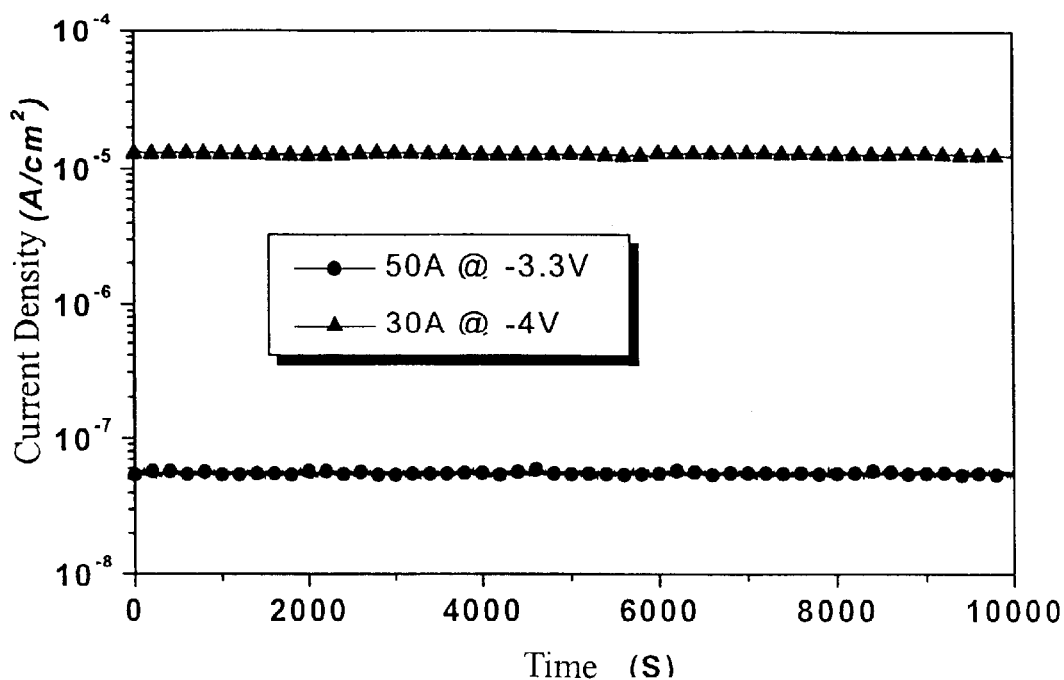
FIG. 10 is a diagram showing the change of current density as a function of time for a $Si_{0.3}Ge_{0.7}$ p-MOS capacitor under an external constant voltage.

After this, the electrical reliability for a SiGe p-MOS gate oxide layer is determined. FIG. 10 illustrates the change of the current density as a function of time for a $Si_{0.3}Ge_{0.7}$ p-MOS capacitor under an external constant voltage. As shown in FIG. 10, under an external constant voltage for 10000 seconds, the current density still maintains at a fixed value, suggesting that the SiGe oxide layer has a good quality.

Figure 11:
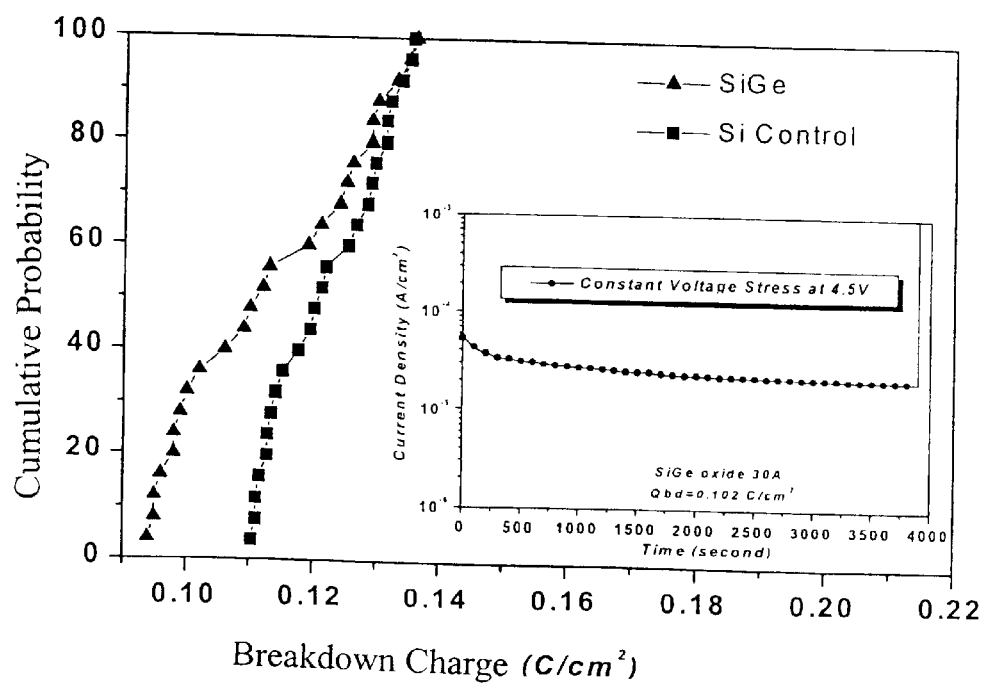
FIG. 11 is a diagram showing the breakdown charge probability distributions for a $Si_{0.3}Ge_{0.7}$ p-MOS capacitor and a standard Si-based p-MOS capacitor.

Continuing to FIG. 11, wherein FIG. 11 compares the breakdown charge probability distribution of a $Si_{0.3}Ge_{0.7}$ and a Si p-MOS capacitor under an external voltage of 4.5 volts. The gate oxide layer in both cases is about 30 angstroms thick. As shown in FIG. 11, under the same cumulative probability, the cumulative breakdown charge ($Q_{BD}$) for both types of the gate oxide layer is very closed. The $Q_{BD}$ for the $Si_{0.3}Ge_{0.7}$ p-MOS capacitor is only slightly lower, indicating that the reliability of the gate oxide layer of the $Si_{0.3}Ge_{0.7}$ p-MOS capacitor is compatible to that of the standard Si-based p-MOS capacitor.

Figure 12:
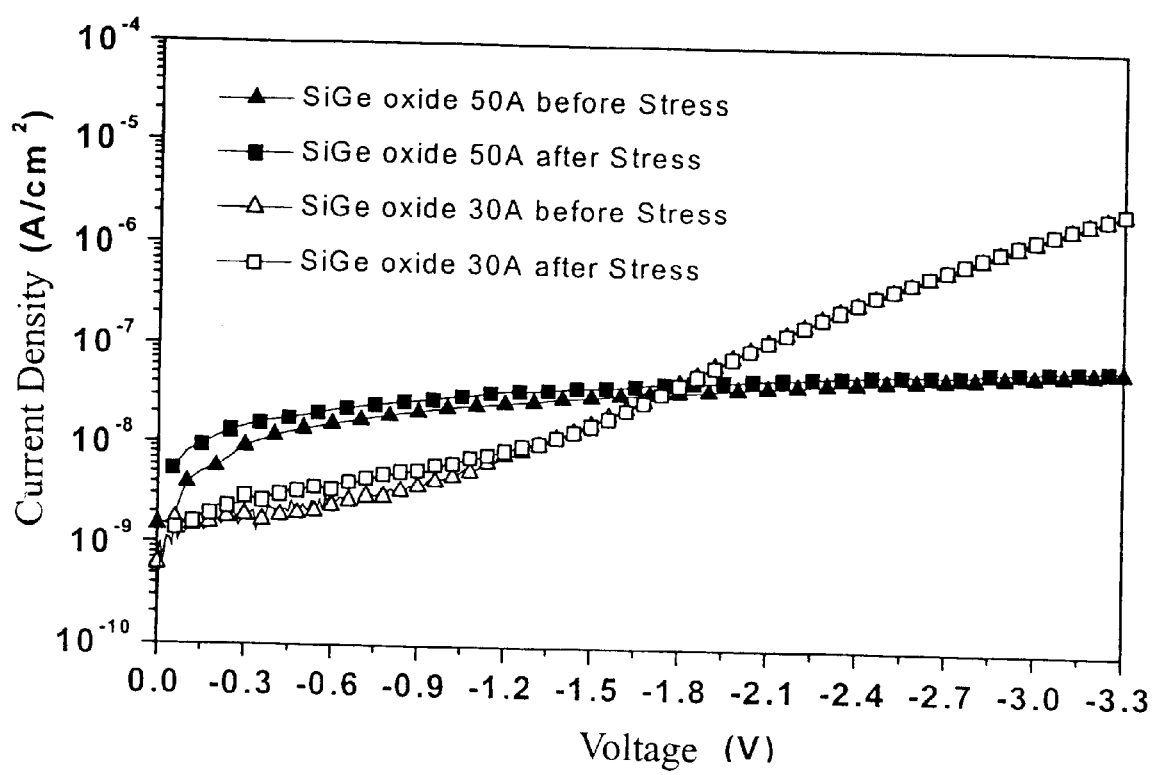
FIG. 12 is a diagram showing the stress-induced leakage current (SILC) for a $Si_{0.3}Ge_{0.7}$ p-MOS under an external voltage.

FIG. 12 represents the stress-induced leakage current (SILC) diagram for a $Si_{0.3}Ge_{0.7}$ p-MOS capacitor under an external voltage. As shown in FIG. 12, the functional relationship between current density and voltage for a 50 angstroms thick gate oxide layer and a 30 angstroms thick gate oxide layer, with each being subjected to an external voltage of 3.4 V and 4.4 V, respectively, for 10000 seconds is described. The results indicate that there is no significant difference in the functional relationship between current density and voltage before and after the induced stress. The SiGe oxide layer formed according to the present invention is thus reliable.

Based on the preferred embodiment of the present invention, the SiGe/Si alloy layer is formed under a high temperature. The strained energy in the SiGe/Si alloy layer is thus lower than the strained energy in a SiGe/Si alloy layer formed under a low temperature. As a result, the SiGe/Si alloy layer can withstand the high temperature thermal processes in the subsequent semiconductor manufacturing, such as the thermal oxidation process in forming the SiGe layer or the anneal process for the driving-in of the implanted ions. The low strained energy in the SiGe/Si alloy layer formed according to the present invention is also responsible for the high electric holes mobility. Experimental results further indicate that the electrical properties of the $SiGe/SiGeO_2$ p-MOS FET or the p-MOS capacitor are compatible to the electrical properties of the $Si/SiO_2$ p-MOSFET or p-MOS capacitor. Furthermore, the SiGe electric hole mobility is about two times higher than the Si electric hole mobility. The experimental results suggest that the application of the SiGe/Si alloy formed according to the present invention would significantly increase the performance efficiency of an integrated device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for growing a silicon-germanium (SiGe) layer, wherein the method comprising:

providing a silicon substrate;

performing a cleaning process on a surface of the silicon substrate;

performing a HF vapor treatment on the silicon substrate; and forming an epitaxial silicon-germanium layer at high temperature on the silicon substrate, wherein the epitaxial silicon-germanium layer is formed by forming a germanium layer on the silicon substrate and performing a rapid thermal anneal process under an inert gas.

2. The method according to claim 1, wherein the step of performing a cleaning process on the surface of the silicon substrate further comprises:

using a $H_2O_2/NH_4OH/H_2O$ solution to clean the surface of the silicon substrate;

soaking the silicon substrate in a HF solution;

cleaning the surface of the silicon substrate with deionized water; and spin-drying the silicon substrate under a nitrogen gas.

3. The method according to claim 1, wherein a composition for the $H_2O_2/NH_4OH/H_2O$ solution is about 0.25–1:0.5–1:5–6.

4. The method according to claim 2, wherein the step of performing a HF vapor treatment process on the silicon substrate includes using a 40% to 60% concentrated HF solution at a saturated vapor pressure.

5. The method according to claim 1, wherein the germanium layer is formed by sputtering.

6. The method according to claim 1, wherein the germanium layer is formed by evaporation.

7. The method according to claim 1, wherein the inert gas does not induce oxidation.

8. The method according to claim 1, wherein the inert gas includes a nitrogen gas.

9. The method according to claim 1, wherein the rapid thermal anneal process is conducted at a temperature of about 850 degree Celsius to about 950 degree Celsius.

10. The method according to claim 1, wherein the rapid thermal anneal process is conducted at a temperature of about 800 degree Celsius to about 1000 degree Celsius.

11. The method according to claim 1, wherein the rapid thermal anneal process is conducted for about 30 seconds to about 120 seconds.

12. A method for growing an epitaxial silicon-germanium (SiGe) layer and a SiGe oxide layer, the method comprising:

providing a silicon substrate, wherein a native oxide layer is formed on the silicon substrate;

removing the native oxide layer;

performing a hydrogen fluoride (HF) vapor treatment process on the silicon substrate surface;

forming a germanium layer on the silicon substrate;

conducting a rapid thermal anneal process under an inert gas to form a silicon-germanium alloy (SiGe/Si) layer; and performing a thermal oxidation process to form a silicon-germanium oxide layer on a surface of the SiGe/Si alloy layer.

13. The method according to claim 12, wherein the native oxide layer is removed by:

cleaning the substrate with a corrosive solution; and removing a residual of the corrosive solution on the silicon substrate surface.

14. The method according to claim 12, wherein the HF vapor treatment process comprises using a 40% to a 60% concentrated HF solution at a saturated vapor pressure.

15. The method according to claim 12, wherein the germanium layer is formed by physical vapor deposition.

16. The method according to claim 12, wherein the inert gas does not induce oxidation.

17. The method according to claim 12, wherein the rapid thermal anneal process is conducted at a temperature of about 850 degree Celsius to about 950 degree Celsius for about 30 seconds to about 120 seconds.

18. The method according to claim 12, wherein the rapid thermal anneal process is conducted at a temperature of about 800 degree Celsius to about 1000 degree Celsius.

19. A method for applying an epitaxial silicon-germanium (SiGe) layer to a manufacturing of a Metal Oxide Semiconductor (MOS) device, the method includes:

providing a silicon substrate, wherein a native oxide layer is on the silicon substrate;

removing the native oxide layer by a corrosive method;

physically vapor depositing a germanium layer on the silicon substrate;

conducting a rapid thermal anneal process under an inert gas to form a silicon-germanium alloy (SiGe/Si) layer on the silicon substrate;

performing a rapid thermal anneal process to form a silicon-germanium (SiGe) oxide layer on a surface of the SiGe/Si alloy layer;

forming a gate on a predetermined region on the oxide layer; and performing an ion implantation process to form a pair of source/drain regions on both sides of the gate.

20. The method according to claim 19, wherein the inert gas does not induce oxidation.

21. The method according to claim 19, wherein the rapid thermal anneal process is conducted at a temperature of about 850 degree Celsius to about 950 degree Celsius for about 30 seconds to about 120 seconds.

22. The method according to claim 19, wherein the rapid thermal anneal process is conducted at a temperature of about 800 degree Celsius to about 1000 degree Celsius for about 30 seconds to about 120 seconds.

23. A method for growing an epitaxial silicon-germanium (SiGe) layer, wherein the method comprising:

providing a silicon substrate;

performing a cleaning process on a surface of the silicon substrate;

performing a HF vapor treatment on the silicon substrate;

forming a germanium layer on the silicon substrate;

conducting a rapid thermal anneal process under an inert gas to form a silicon-germanium alloy (SiGe/Si) on the surface of the silicon substrate; and performing a thermal oxidation process to form a silicon-germanium oxide layer on a surface of the SiGe/Si alloy layer.

* * * * *